United States Patent
Kanaya et al.

(10) Patent No.: US 6,888,428 B2
(45) Date of Patent: May 3, 2005

(54) HIGH FREQUENCY SEMICONDUCTOR INTEGRATED CIRCUIT CAPABLE OF SWITCHING BETWEEN CHARACTERISTICS

(75) Inventors: Ko Kanaya, Hyogo (JP); Shin Chaki, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 122 days.

(21) Appl. No.: 09/972,955

(22) Filed: Oct. 10, 2001

(65) Prior Publication Data

US 2002/0186089 A1 Dec. 12, 2002

(30) Foreign Application Priority Data

Jun. 7, 2001 (JP) ........................................ 2001-172363

(51) Int. Cl.$^7$ .............................. H03H 7/00; H03F 3/60
(52) U.S. Cl. ..................... 333/247; 333/33; 330/286; 330/302
(58) Field of Search ........................ 333/33, 247, 246; 330/286, 302

(56) References Cited

U.S. PATENT DOCUMENTS 4,353,047 A * 10/1982 Noguchi et al. ............ 333/247
4,479,100 A * 10/1984 Moghe et al. ................ 333/33
5,880,657 A * 3/1999 Dorschky et al. ........... 333/246
6,346,859 B1 * 2/2002 Saitou ......................... 330/286

FOREIGN PATENT DOCUMENTS

JP 64-37859 2/1989

* cited by examiner

Primary Examiner—Benny Lee
Assistant Examiner—Stephen E. Jones
(74) Attorney, Agent, or Firm—Leydig, Voit & Mayer, Ltd.

(57) ABSTRACT

A high frequency semiconductor integrated circuit includes a main circuit, a circuit block, a pad, and a wire. The main circuit includes an input terminal, a transistor, transmission lines, a pad, and an output terminal. The circuit block includes a passive circuit and a capacitor. The pad is disposed close to the circuit block. The wire connects the pad to the pad included in the main circuit. In the high frequency semiconductor integrated circuit, the main circuit outputs an input signal input at the input terminal from the output terminal through the transistor, the transmission line, the pad, and another transmission line. As a result, the high frequency semiconductor integrated circuit can realize various performances and can be used in many applications.

1 Claim, 12 Drawing Sheets

HIGH FREQUENCY SEMICONDUCTOR INTEGRATED CIRCUIT CAPABLE OF SWITCHING BETWEEN CHARACTERISTICS

BACKGROUND OF THE INVENTION

1. Field of the Invention

The present invention relates to a high frequency semiconductor integrated circuit realizing a good high frequency characteristic by changing a combination of plural circuits according to performance or application.

2. Description of the Background Art

Figure 22:
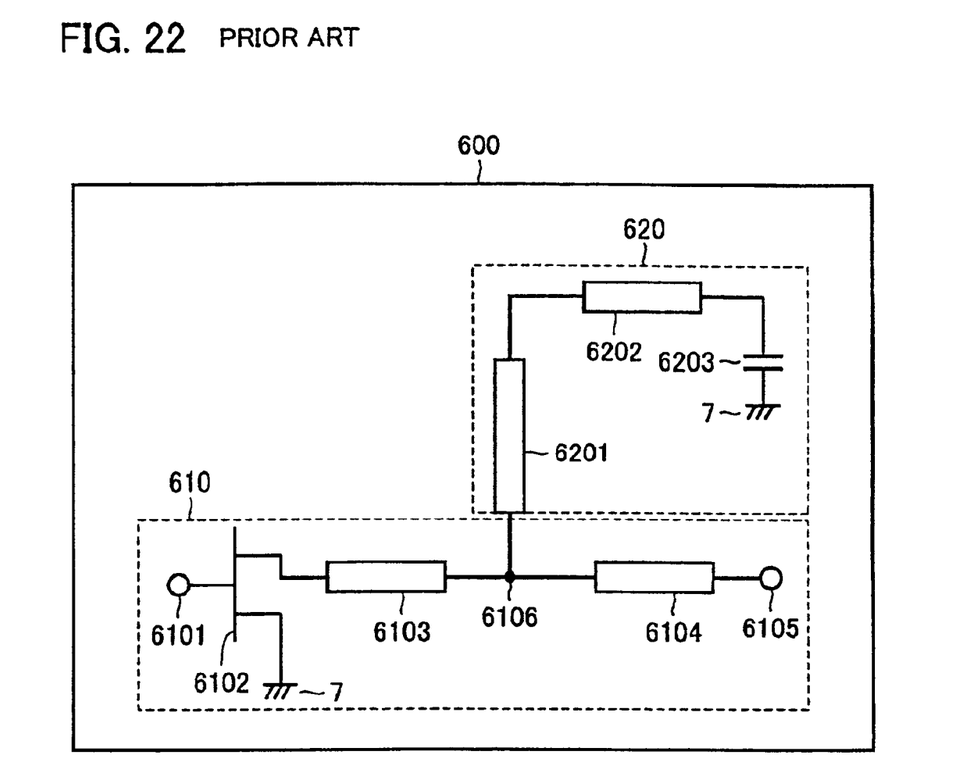
FIG. 22 is a circuit diagram of a prior art high frequency semiconductor integrated circuit.

Referring to FIG. 22, a prior art high frequency semiconductor integrated circuit 600 includes a main circuit 610 and a circuit block 620.

Main circuit 610 includes an input terminal 6101, a transistor 6102, transmission lines 6103 and 6104, and an output terminal 6105. Transistor 6102 is connected to input terminal 6101 at its gate terminal, to a ground node 7 at its source terminal, and to transmission line 6103 at its drain terminal. Transistor 6102 is, to be specific, a field effect transistor such as a MOS FET, or a MES FET (Metal Semiconductor Field Effect Transistor), HEMT (High Electron Mobility Transistor) or HET (Heterojunction Bipolar Transistor) made from GaAs.

Transmission lines 6103 and 6104 are connected in series between the drain terminal of transistor 6102 and output terminal 6105. Transmission lines 6103 and 6104 are each an interconnect having a predetermined length and a predetermined width and formed by patterning in fabrication of high frequency semiconductor integrated circuit 600.

Circuit block 620 includes passive circuits 6201 and 6202 and a capacitor 6203. Passive circuits 6201 and 6202 and capacitor 6203 are connected in series between a node 6106 of main circuit 610 and ground node 7. Passive circuits 6201 and 6202, for example, are each configured such that a resistor, a coil and a capacitor, which are passive elements, are connected in series with or in parallel to each other. That is, passive circuits 6201 and 6202, used together with capacitor 6203, each include a circuit of a configuration in which a resistor, a coil and a capacitor are combined in a proper manner such that when an input signal inputted to input terminal 6101 is outputted from output terminal 6105 in main circuit 610, output matching, efficiency matching, gain matching and distortion matching can be achieved.

Main circuit 610 receives an input signal having a frequency in the range of microwaves or milliwaves at input terminal 6101 and outputs the received input signal from output terminal 6105 through transistor 6102 and transmission lines 6103 and 6104.

In a case where passive circuits 6201 and 6202 of circuit block 620 are each constituted of a passive element optimized for output matching, main circuit 610 performs output matching and outputs an input signal inputted at input terminal 6101 from output terminal 6105. Furthermore, in a case where passive circuits 6201 and 6202 are each constituted of a passive element optimized for efficiency matching, main circuit 610 performs efficiency matching and outputs an input signal inputted at input terminal 6101 from output terminal 6105.

In prior art high frequency semiconductor integrated circuit 600, however, circuit block 620 is connected to node 6106 of main circuit 610; therefore, when only main circuit 610 is desired to be used, or when a high frequency semiconductor integrated circuit having a different performance is requested, a problem arises since separate circuit patterns are required. That is, when passive circuits 6201 and 6202, each constituted of a passive element optimized for output matching, are incorporated into circuit block 620, only main circuit 610 cannot be used and further, high frequency semiconductor integrated circuit 600 cannot be differently used as a high frequency semiconductor integrated circuit for achieving efficiency matching.

Furthermore, once a circuit pattern is formed on a semiconductor substrate, a circuit block cannot be adjusted if variations occur in performance of an active element, leading to another problem of decrease in product yield of a high frequency semiconductor integrated circuit.

SUMMARY OF THE INVENTION

It is, accordingly, an object of the present invention to provide a high frequency semiconductor integrated circuit capable of switching between characteristics thereof.

It is another object of the present invention to provide a high frequency semiconductor integrated circuit capable of performing circuit adjustment for improving a high frequency characteristic.

According to the present invention, a high frequency semiconductor integrated circuit includes: a main circuit having an active element and a first pad therein; a circuit block constituted of a passive element; a second pad connected to the circuit block; and a wire to connect the first pad to the second pad.

It is preferable that the main circuit includes the active element and the first pad between an input terminal and an output terminal.

It is preferable that the circuit block includes a passive element whose impedance decreases with increase in frequency of an input signal inputted at the input terminal.

It is preferable that the circuit block includes an interconnect connected to the second pad and the sum of a length of the wire and a length of the interconnect is equal to one-fourth of a wavelength of a high frequency signal inputted at the input terminal.

Furthermore, according to the present invention, a high frequency semiconductor integrated circuit includes: a main circuit having an active element and a main pad therein; plural circuit blocks each constituted of a passive element; plural connection pads provided correspondingly to the respective plural circuit blocks; and a wire for connecting the main pad to one of the plural connection pads.

It is preferable that the main circuit includes the active element and the main pad between an input terminal and an output terminal.

It is preferable that the plural circuit blocks include a first circuit block for adjusting an impedance of the main circuit to be a first impedance, a second circuit block for adjusting the impedance of the main circuit to be a second impedance, and a third circuit block for adjusting the impedance of the main circuit to be a third impedance.

It is preferable that the first circuit block is constituted of a first capacitor having a first capacity, and connected to a ground node at one end thereof and a first connection pad at the other end thereof, the second circuit block is constituted of a second capacitor having a second capacity, and connected to the ground node at one end thereof and a second connection pad at the other end thereof and the third circuit block is constituted of a third capacitor having a third capacity, and connected to the ground node at one end thereof and a third connection pad at the other end thereof.

Furthermore, according to the present invention, a high frequency semiconductor integrated circuit includes a first high frequency semiconductor integrated circuit, a second high frequency integrated circuit, and a main wire for connecting the first high frequency semiconductor integrated circuit to the second high frequency semiconductor integrated circuit.

It is preferable that the first high frequency semiconductor integrated circuit includes a main circuit having an active element, and a circuit block having a passive element, and the second high frequency semiconductor integrated circuit includes only a main circuit having an active element.

It is preferable that the second high frequency semiconductor integrated circuit includes a first main circuit having a first active element and a first pad, and the first high frequency semiconductor integrated circuit includes a circuit block having a passive element, a second pad connected to the circuit block, a second main circuit having a third pad for connecting the first and second pads with each other, and a second active element, and a wire for connecting the second pad to the third pad, wherein the main wire connects the first pad to the third pad.

It is preferable that the first main circuit further includes an interconnect connected to the first pad at one end thereof and the first active element at the other end thereof, and an output terminal connected to the first active element; and the second main circuit further includes an interconnect connected to the third pad at one end thereof and the second active element at the other end thereof, and an input terminal connected to the second active element.

It is preferable that the circuit block includes a passive element for matching an impedance of the first main circuit to an impedance of the second main circuit.

It is preferable that the first high frequency semiconductor integrated circuit includes only a main circuit having an active element and the second high frequency semiconductor integrated circuit includes only a circuit block having a passive element.

It is preferable that the first high frequency semiconductor integrated circuit includes only a main circuit having an active element and a main pad, and the second high frequency semiconductor integrated circuit includes plural circuit blocks each having a passive element and plural connection pads provided correspondingly to the respective plural circuit blocks, wherein the main wire connects the main pad to one of the plural connection pads.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Detailed description will be given of embodiments of the present invention referring to the accompanying drawings. Note that the same symbols are attached to the same or corresponding constituents in the figures and description thereof is not repeated.

First Embodiment

Figure 1:
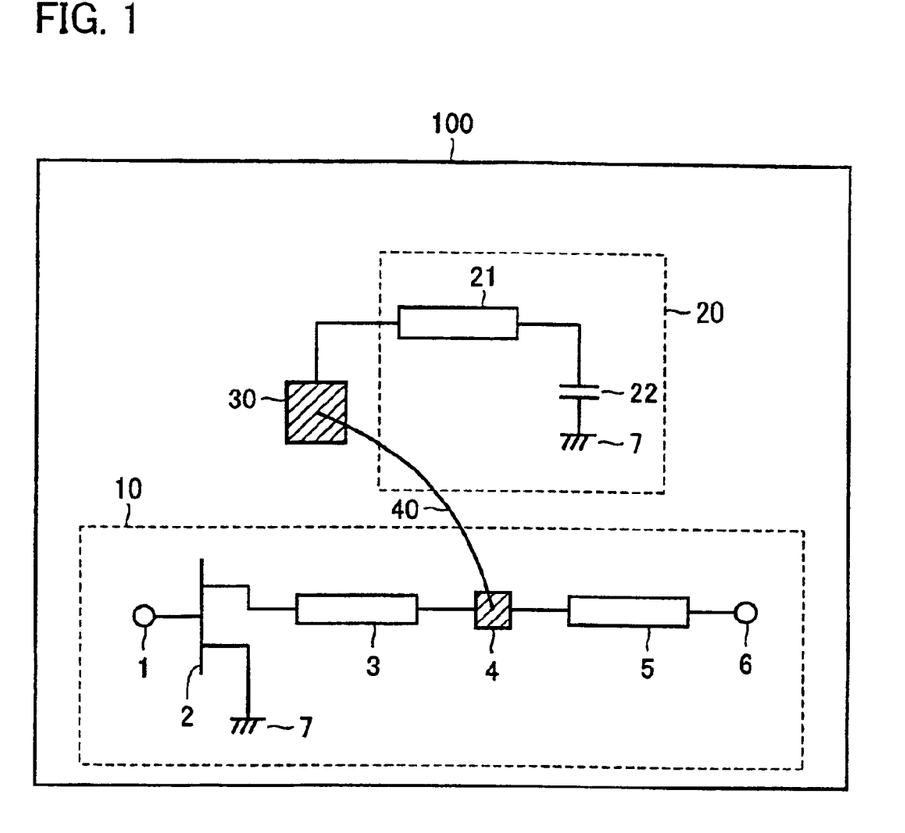
FIG. 1 is a circuit diagram of a high frequency semiconductor integrated circuit according a first embodiment.

Referring to a FIG. 1, a high frequency semiconductor integrated circuit 100 according to the first embodiment includes a main circuit 10, a circuit block 20, a pad 30, and a wire 40. Main circuit 10, circuit block 20 and pad 30 are fabricated on one semiconductor substrate.

Main circuit 10 includes an input terminal 1, a transistor 2, transmission lines 3 and 5, a pad 4, and an output terminal 6. Transistor 2 is connected to input terminal 1 at the gate terminal thereof, a ground node 7 at the source terminal thereof and transmission line 3 at the drain terminal thereof. Transmission line 3 is disposed between the drain terminal of transistor 2 and pad 4. Transmission line 5 is disposed between pad 4 and the output terminal 6.

Circuit block 20 includes a passive circuit 21 and a capacitor 22. Passive circuit 21 and capacitor 22 are connected in series between pad 30 and ground node 7. Pad 30 is disposed close to circuit block 20. Wire 40 connects pad 30 to pad 4 included in main circuit 10. Therefore, circuit block 20 is connected in parallel to a circuit extending from input terminal 1 to output terminal 6.

Figure 2:
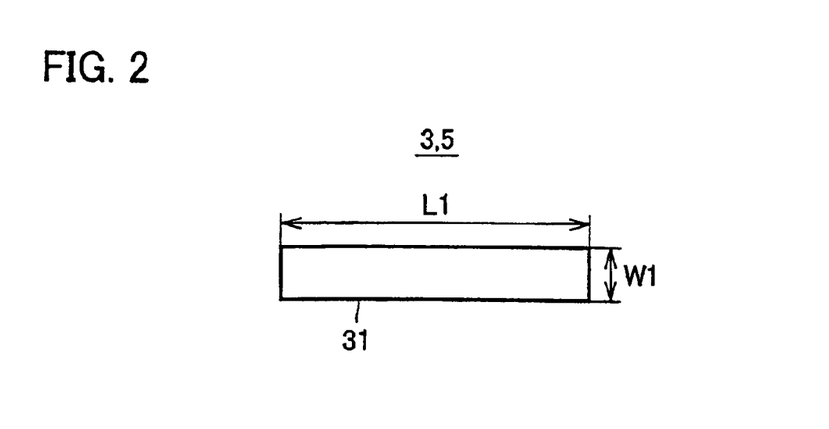
FIG. 2 is a plan view of a transmission line shown in FIG. 1.

Referring to FIG. 2, transmission lines 3 and 5 are constituted of an interconnect 31 made from gold (Au). Interconnect 31 has a length L1 and a width W1. Therefore, transmission lines 3 and 5 each has an impedance characteristic having a parallel resonance point for a frequency of an input signal.

Figure 3:
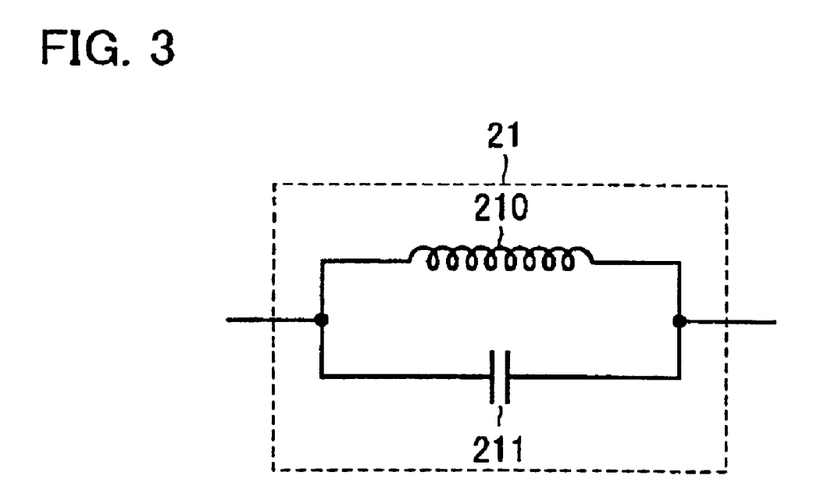
FIG. 3 is a plan view of interconnection constituting a passive circuit included in a circuit block shown in FIG. 1.

Referring to FIG. 3, passive circuit 21 is constituted of a coil 210 and a capacitor 211, for example. Coil 210 and capacitor 211 are connected in parallel to each other. Therefore, circuit block 20 has one series resonance point and one parallel resonance point for a frequency of an input signal and an impedance characteristic approaching zero at the final stage. If a capacity of capacitor 22 is C1 [F], a capacity of capacitor 211 is C2 [F] and a frequency of the input signal is f [Hz] by definition, an impedance of capacitor 22 is determined by $1/(2\pi fC1)$ and an impedance of capacitor 211 is determined by $1/(2\pi fC2)$; therefore, the impedance of each of capacitors 22 and 211 approaches zero with increase in frequency f. Hence, an impedance of circuit block 20 approaches zero as a frequency of the input signal increases. Note that a frequency f of the input signal falls in the range of microwaves or milliwaves.

As described above, main circuit 10 is one including an active element and circuit block 20 is one constituted of a passive element.

Referring again to FIG. 1, in main circuit 10, an input signal inputted at input terminal 1 is transmitted to pad 4 through transistor 2 and transmission line 3. The input signal is further transmitted from pad 4 to transmission line 5 and to wire 40. The input signal outputted to transmission line 5 is transmitted through transmission line 5 and outputted from output terminal 6.

On the other hand, the input signal transmitted to wire 40 is transmitted through wire 40 and inputted to circuit block 20 through pad 30. In this case, wire 40 functions on the input signal as an equivalent circuit constructed of parallel circuits each constituted of a coil and a capacitor connected at plural stages. Hence, an impedance of wire 40 approaches zero with a frequency of the input signal being high. As a result, wire 40 and circuit block 20 combined is in an open state as an effect exerted on pad 4 and an input signal inputted at input terminal 1 is transmitted through main circuit 10 with decreased transmission leakage and outputted from output terminal 6. In this case, main circuit 10 does not output any signal having a frequency other than a frequency of the input signal.

Figure 4:
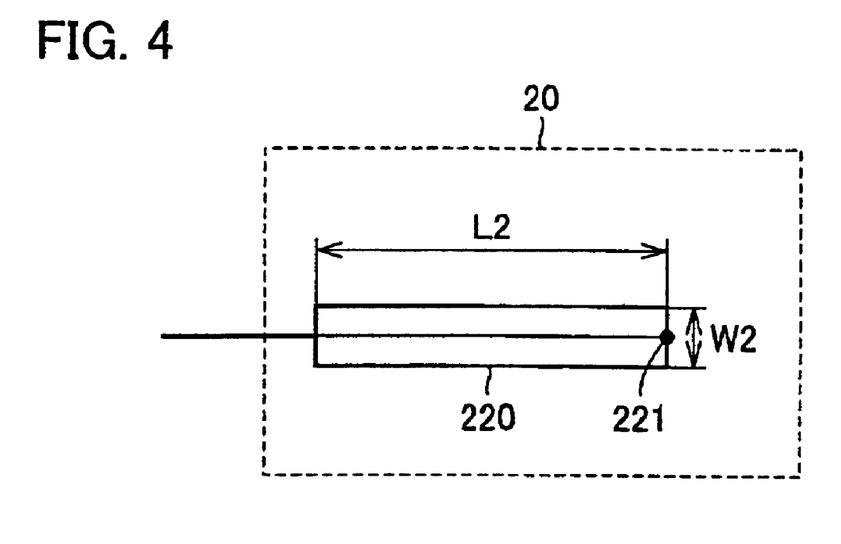
FIG. 4 is a plan view showing another example of the passive circuit included in a circuit block shown in FIG. 1.

Referring to FIG. 4, circuit block 20 may also be constituted of an interconnect 220. Interconnect 220 is formed when circuit block 20 is fabricated and has dimensions of a length L2 and a width W2. In this case, if a length of wire 40 is Lw and a wavelength of the input signal is λ, length Lw of wire 40 and length L2 of interconnect 220 are determined such that $\lambda/4=Lw+L2$. If $\lambda/4=Lw+L2$, an amplitude of an input signal transmitted through wire 40 and pad 30 to interconnect 220 from pad 4 is reduced to zero at one end 221 of interconnect 220. That is, a circuit constituted of wire 40 and interconnect 220 becomes a shorted circuit. Therefore, wire 40 and circuit block 20 combined enters an open state as an effect exerted on pad 4 and an input signal inputted at input terminal 1 is transmitted through main circuit 10 with decreased transmission leakage and outputted from output terminal 6. In this case, main circuit 10 does not output a signal of any frequency other than a frequency of the input signal.

As described above, in a case where a circuit configured such that passive circuit 21 and capacitor 22 as shown in FIG. 3 are connected in series with each other as circuit block 20, or alternatively, in a case where interconnect 220 shown in FIG. 4 is used as circuit block 20, there can be fabricated high frequency semiconductor integrated circuit 100 capable of transmitting an input signal through main circuit 10 preventing transmission leakage of the input signal from occurring. When only main circuit 10 of high frequency semiconductor integrated circuit 100 is desired to be used, wire 40 has only to be disconnected and no necessity arises for separately fabricating a high frequency semiconductor integrated circuit constituted of main circuit 10 only. In such a way, a high frequency semiconductor integrated circuit capable of transmitting an input signal preventing transmission leakage from occurring by connecting circuit block 20 to main circuit 10 with wire 40 can also be functioned as a high frequency semiconductor integrated circuit constituted of main circuit 10 only. The present invention features that wire 40 functions as one circuit transmitting an input signal of high frequency as described above.

According to the first embodiment, since a high frequency semiconductor integrated circuit includes a main circuit and a circuit block connected by a wire therebetween, there can be realized a high frequency semiconductor integrated circuit having plural performances according to the presence or absence of wire connection.

Second Embodiment

Figure 5:
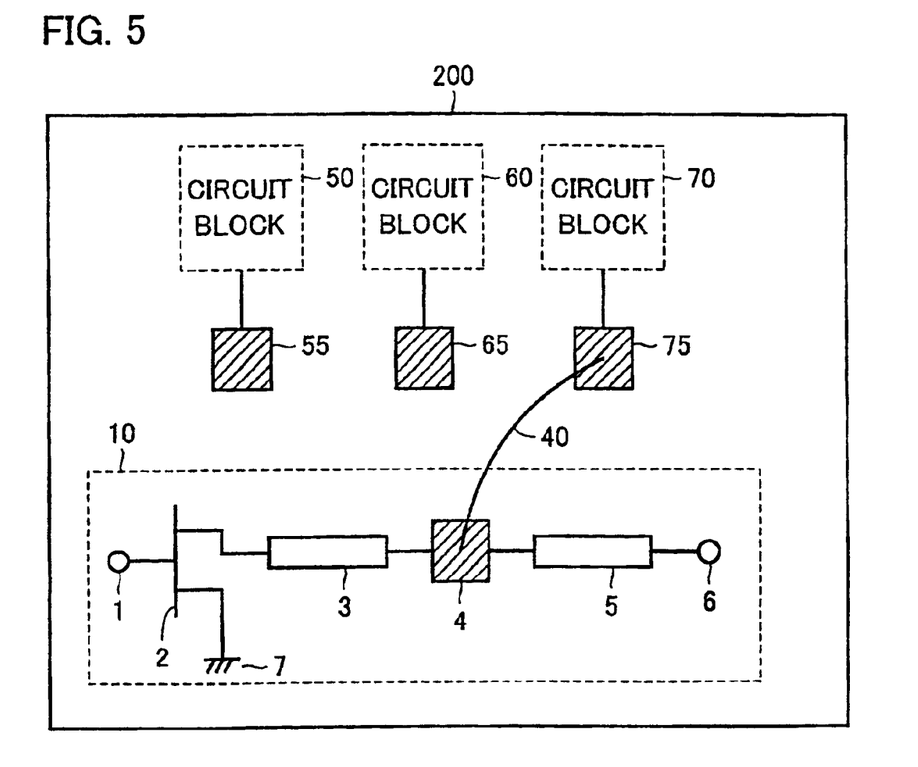
FIG. 5 is a block diagram and a circuit diagram of a high frequency semiconductor integrated circuit according to a second embodiment.

Referring to FIG. 5, a high frequency semiconductor integrated circuit 200 according to the second embodiment includes: main circuit 10; wire 40; circuit blocks 50, 60 and 70; and pads 55, 65 and 75. Main circuit 10 is as described above. Pads 55, 65 and 75 are provided correspondingly to respective circuit blocks 50, 60 and 70. Wire 40 connects pad 4 included in main circuit 10 to one of pads 55, 65 and 75.

Figure 6:
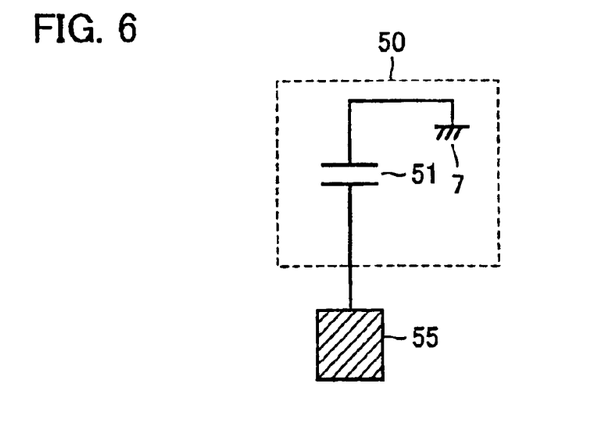
FIG. 6 is a circuit diagram of a circuit block shown in FIG. 5.

Referring to FIG. 6, circuit block 50 includes a capacitor 51. One electrode of capacitor 51 is connected to ground node 7 and the other electrode of capacitor 51 is connected to pad 55. Capacitor 51 has a capacitance C3 [F].

Figure 7:
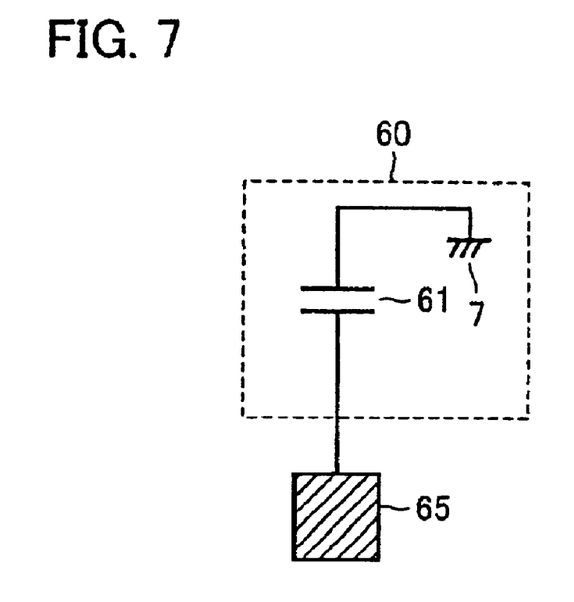
FIG. 7 is a circuit diagram of another circuit block shown in FIG. 5.

Referring to FIG. 7, circuit block 60 includes capacitor 61. One electrode of capacitor 61 is connected to ground node 7 and the other electrode thereof is connected to pad 65. Capacitor 61 has a capacitance C4 [F].

Figure 8:
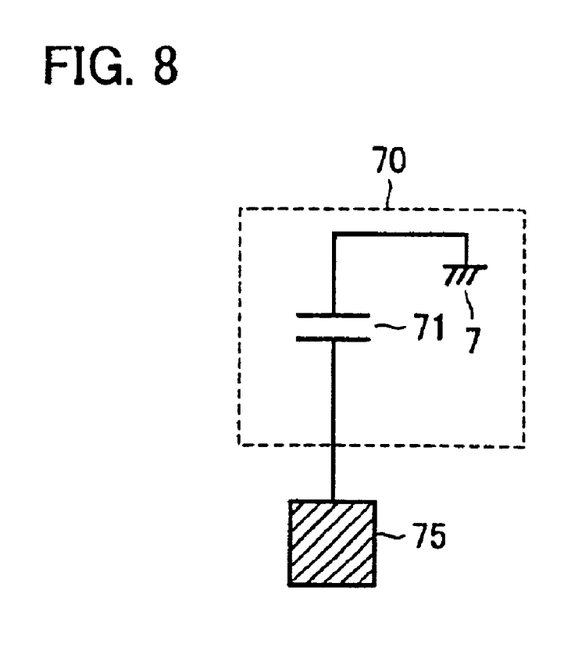
FIG. 8 is a circuit diagram of yet another circuit block shown in FIG. 5.

Referring to FIG. 8, circuit block 70 includes a capacitor 71. One electrode of capacitor 71 is connected to ground node 7 and the other electrode thereof is connected to pad 75. Capacitor 71 has a capacitance C5 [F].

Figure 9:
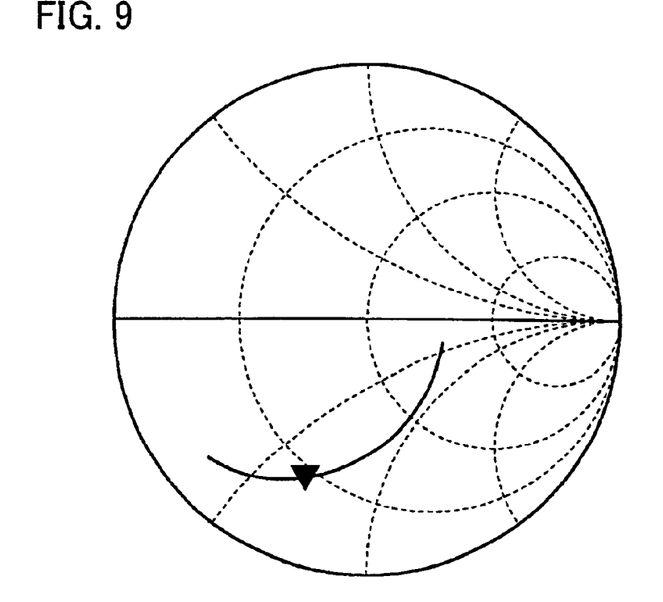
FIG. 9 is a Smith chart.

Referring again to FIG. 5, since wire 40 functions on an input signal as an equivalent circuit constructed of parallel circuits each constituted of a coil and a capacitor connected at plural stages as described above, there can be realized a high frequency semiconductor integrated circuit having a different performance according to which of pads 55, 65 and 75 wire 40 is connected to. When an output impedance of a transistor has an impedance shown in FIG. 9, there can be realized a high frequency semiconductor integrated circuit having an impedance shown in FIG. 10 by connecting pad 55 to pad 4 of main circuit 10 with wire 40. In this case, capacitance C3 of capacitor 51 included in circuit block 50 is determined such that reactance of wire 40 and circuit block 50 combined becomes zero. That is, capacitance C3 of capacitor 51 is determined such that an impedance of wire 40 and circuit block 50 combined is located on a real axis of the Smith chart shown in FIG. 10. Circuit block 50 is connected to main circuit 10 by wire 40 and another circuit block constituting of an impedance converter is disposed at output terminal 6 side with respect to pad 4, whereby high frequency semiconductor integrated circuit 200 can function as a high frequency semiconductor integrated circuit having been subjected to gain matching.

Figure 11:
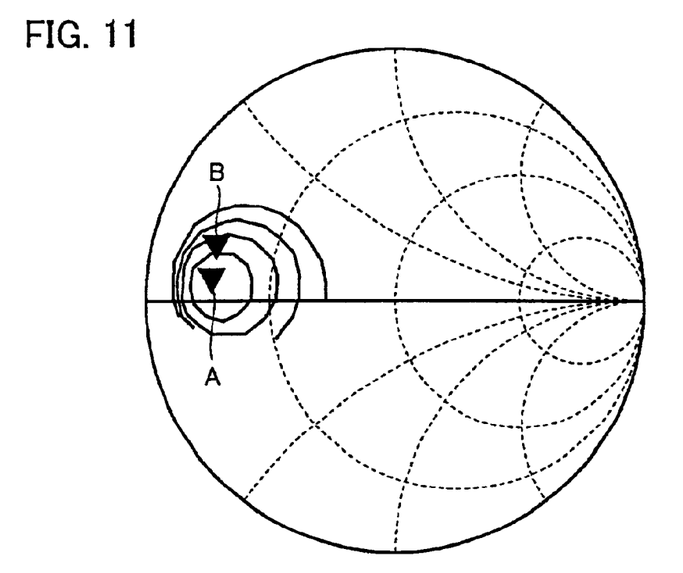
FIG. 11 is a Smith chart containing constant-efficiency circles.

Furthermore, by connecting circuit block 60 to main circuit 10 with wire 40, there can be realized a high frequency semiconductor integrated circuit having an impedance at point A on the Smith chart shown in FIG. 11. In this case, capacitance C4 of capacitor 61 included in circuit block 60 is determined such that an impedance of wire 40 and circuit block 60 combined is located at point A above the real axis.

Still furthermore, by connecting circuit block 70 to main circuit 10 with wire 40, there can be realized a high frequency semiconductor integrated circuit having an impedance of point B on the Smith chart shown in FIG. 11. In this case, capacitance C5 of capacitor 71 included in circuit block 70 is determined such that an impedance of wire 40 and circuit block 70 combined is located at point B above the real axis.

Figure 10:
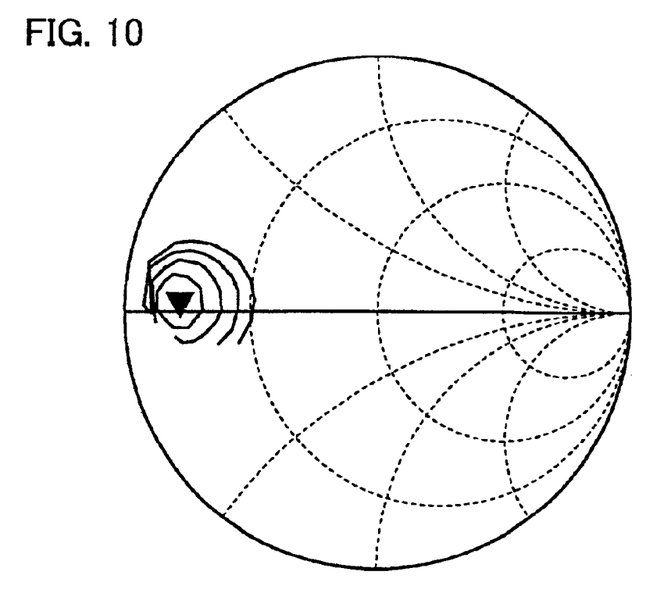
FIG. 10 is a Smith chart containing constant-output circles.

A circle depicted on the Smith chart shown in FIG. 10 is a constant-output circle, which is obtained by changing capacitance C3 of capacitor 51 included in circuit block 50. Therefore, by changing capacitance C3 of capacitor 51 included in circuit block 50, there can be realized a high frequency semiconductor integrated circuit having an impedance thereof moving on a constant-output circle shown in FIG. 10. On the other hand, a circle on the Smith chart shown in FIG. 11 shows a constant-efficiency circle and a constant-efficiency circle can be obtained by changing capacitance C4 and C5 of capacitors 61 and 71 included in respective circuit blocks 60 and 70. Therefore, by changing capacitance C4 and C5 of capacitors 61 and 71 included in respective circuit blocks 60 and 70, there can be realized a high frequency semiconductor integrated circuit having an impedance moving on a constant-efficiency circle shown in FIG. 11.

As described above, main circuit 10 is a circuit including an active element and circuit blocks 50, 60 and 70 are each a circuit constituted of a passive element.

High frequency semiconductor integrated circuit 200 can also function not only as one including only main circuit 10 by disconnecting wire 40, but as one having each of various kinds of performances described above by connecting one of circuit blocks 50, 60 and 70 to main circuit 10.

In the above description, although circuit blocks 50, 60 and 70 are each handled as one including one capacitor, circuit blocks 50, 60 and 70 may include plural capacitors respectively, any of which can be selected. With such configurations, when there occur variations in characteristic of an active element (a transistor) included in main circuit 10, the variations in characteristic of the active element can be adjustably removed by selecting one of capacitors included in respective circuit blocks 50, 60 and 70. In this case, as a transistor, there can be considered a field effect transistor such as a MOS transistor, or MES FET, HEMT or HBT using GaAs.

A circuit block may be disposed not only at the output side of a transistor, but also at the input side or at both of the input side and output side thereof.

Although in the above description, one circuit block is connected to main circuit 10 by wire 40, plural circuit blocks are selected and connected in series or in parallel.

According to the second embodiment, since a high frequency semiconductor integrated circuit includes: a main circuit; and plural circuit blocks that can be connected to the main circuit by a wire, there can be fabricated a high frequency semiconductor integrated circuit capable of realizing plural performances by selecting a circuit block to be connected to the main circuit with wire.

Third Embodiment

Figure 12:
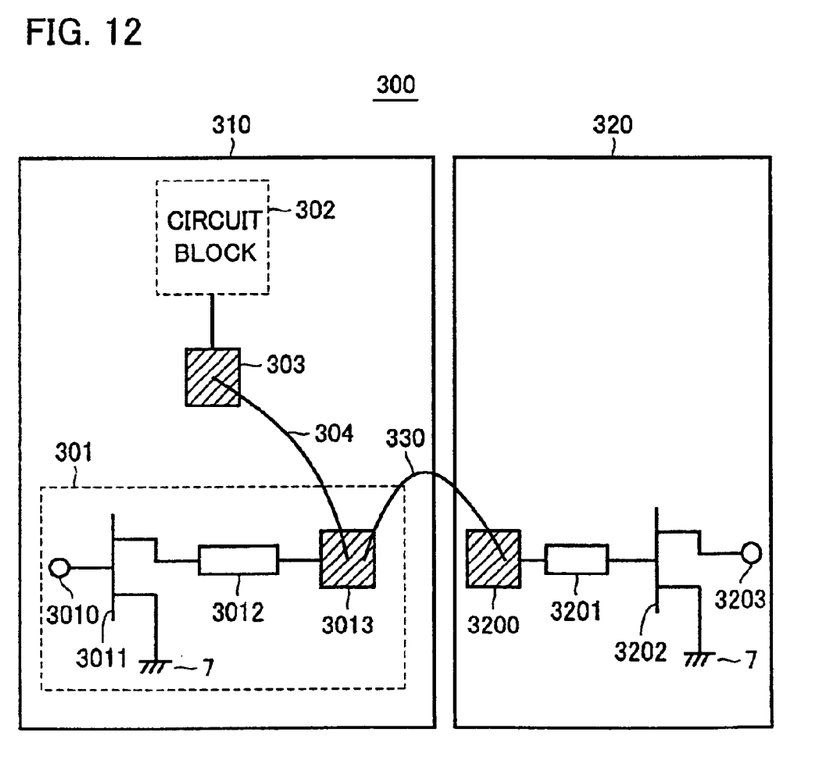
FIG. 12 is a block diagram and a circuit diagram of a high frequency semiconductor integrated circuit according to a third embodiment.

Referring to FIG. 12, a high frequency semiconductor integrated circuit 300 according to the third embodiment includes a high frequency semiconductor integrated circuit 310, a high frequency semiconductor integrated circuit 320, and a wire 330.

High frequency semiconductor integrated circuit 310 includes a main circuit 301, a circuit block 302, a pad 303, and a wire 304. Main circuit 301 includes an input terminal 3010, a transistor 3011, a transmission line 3012, and a pad 3013. Transistor 3011 is connected to input terminal 3010 at the gate terminal thereof and ground node 7 at the source terminal thereof and transmission line 3012 at the drain terminal thereof. Transmission line 3012 is connected between the drain terminal of transistor 3011 and pad 3013.

Pad 303 is disposed close to circuit block 302. Wire 304 connects pad 303 to pad 3013 of main circuit 301 to connect circuit block 302 to main circuit 301.

High frequency semiconductor integrated circuit 320 includes a pad 3200, a transmission line 3201, a transistor 3202, and an output terminal 3203. Transmission line 3201 is connected between pad 3200 and the gate terminal of transistor 3202. Transistor 3202 is connected to transmission line 3201 at the gate terminal thereof, ground terminal 7 at the source terminal thereof and output terminal 3203 at the drain terminal thereof. That is, high frequency semiconductor integrated circuit 320 is one including an active element similar to main circuit 301 of high frequency semiconductor integrated circuit 310.

Wire 330 connects pad 3013 included in main circuit 301 of high frequency semiconductor integrated circuit 310 to pad 3200 of high frequency semiconductor integrated circuit 320.

Figure 13A:
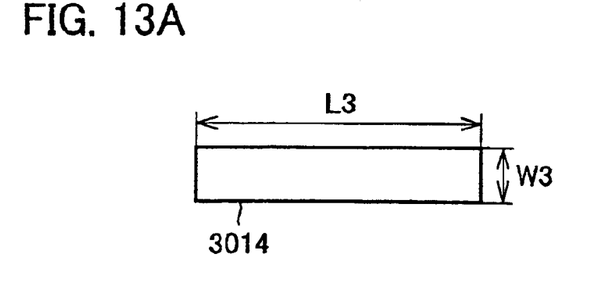
FIGS. 13A and 13B are plan views of transmission lines shown in FIG. 12.
Figure 13B:
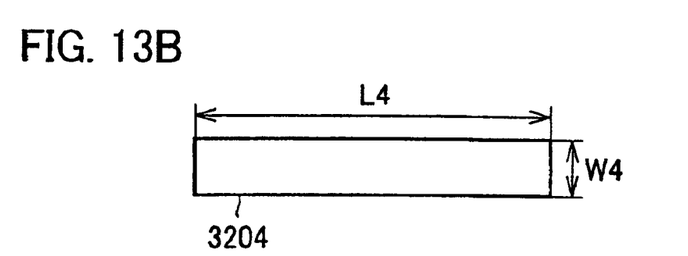

Referring to FIG. 13A, transmission line 3012 is constituted of an interconnect 3014. Interconnect 3014 has dimensions of a length L3 and a width W3. Furthermore, referring to FIG. 13B, transmission line 3201 is constituted of an interconnect 3204. Interconnect 3204 has dimensions of a length L4 and a width W4. Therefore, main circuit 301 of high frequency semiconductor integrated circuit 310 has an impedance different from an impedance of high frequency semiconductor integrated circuit 320.

Figure 14:
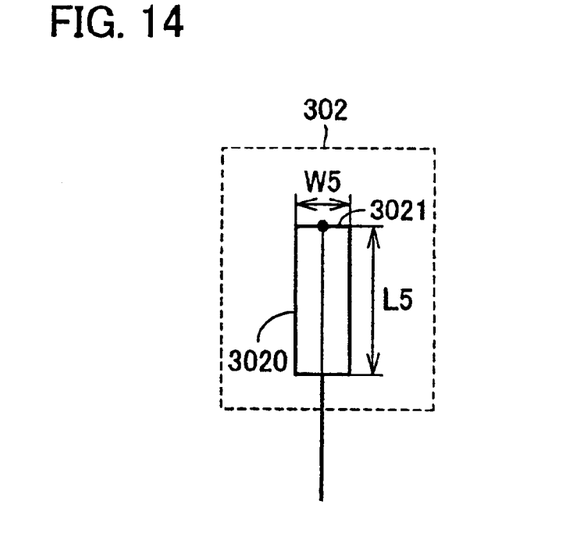
FIG. 14 is a plan view showing an example of a circuit block shown in FIG. 12.

Referring to FIG. 14, circuit block 302 is constituted of an interconnect 3020. Interconnect 3020 has dimensions of a length L5 and a width W5. When a length of wire 304 is Lw and a wavelength of an input signal is $\lambda$, length L5 of interconnect 3020 and length Lw of wire 304 are determined such that $\lambda/4=Lw+L5$ and an impedance of main circuit 301 matches to an impedance of high frequency semiconductor integrated circuit 320. In this case, an amplitude of an input signal becomes zero at one end 3021 of interconnect 3020 to enter a shorted state. Therefore, an impedance of wire 304 and circuit block 302 combined becomes zero as an effect exerted on pad 3013. Then, an input signal inputted at input terminal 3010 is transmitted to pad 3013 through transistor 3011 and transmission line 3012 and further onto wires 304 and 330 by pad 3013. Since an impedance of wire 304 and circuit block 302 combined is zero and an impedance of main circuit 301 has matched to high frequency semiconductor integrated circuit 320 in impedance, the input signal is transmitted to pad 3200 through wire 330 without a loss. Then, the input signal is outputted from output terminal 3203 through transmission line 3201 and transistor 3202.

As described above, main circuit 301 is a circuit including an active element and circuit block 302 is a circuit constituted of a passive element. Furthermore, high frequency semiconductor integrated circuit 320 is constituted of a circuit including an active element similar to main circuit 301.

In high frequency semiconductor integrated circuit 300, circuit block 302 performs a function to cause an impedance of main circuit 301 to match to an impedance of high frequency semiconductor integral circuit 320. Furthermore, pad 3013 performs a function to connect circuit block 302 to main circuit 301 and a function to connect high frequency semiconductor integrated circuit 320 to high frequency semiconductor integrated circuit 310. In such way, by not only connecting a circuit block to a main circuit but also connecting integrated circuits formed on respective different semiconductor substrates to each other, a chip size of high frequency semiconductor integrated circuit 300 can be reduced.

Furthermore, by disconnecting wire 330, high frequency semiconductor integrated circuit 310 and high frequency semiconductor integrated circuit 320 can be operated independently of each other. Moreover, in high frequency semiconductor integrated circuit 310, by disconnecting wire 304, high frequency semiconductor integrated circuit 300 can be operated as a high frequency semiconductor integrated circuit including main circuit 301 only.

According to the third embodiment, a high frequency semiconductor integrated circuit is constructed by connecting two high frequency semiconductor integrated circuits with a wire and a pad for use in connecting a circuit block to a main circuit with a wire in one high frequency semiconductor integrated circuit is further used in connecting two high frequency semiconductor integrated circuits therebetween, thereby enabling a chip size of a high frequency semiconductor integrated circuit to be reduced.

Fourth Embodiment

Figure 15:
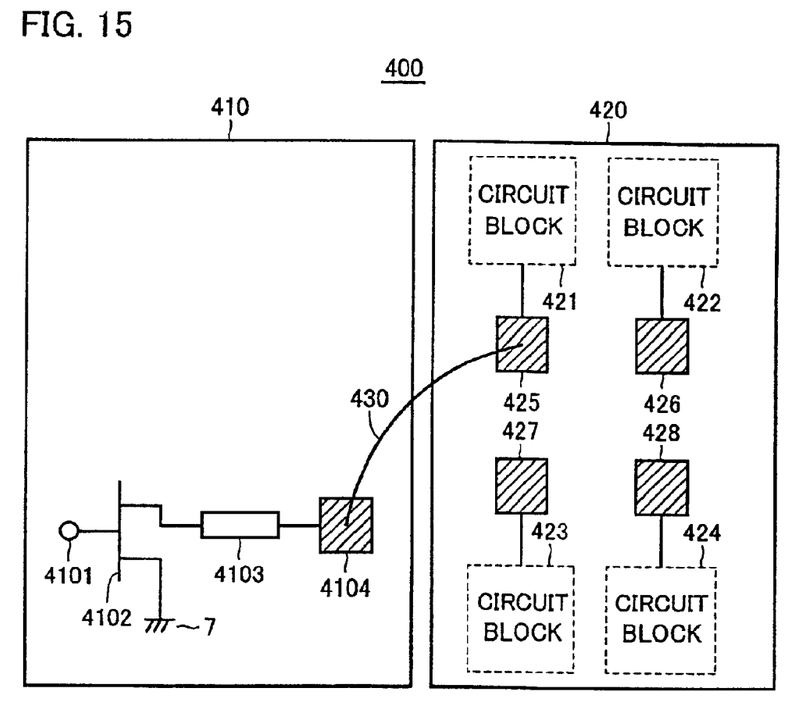
FIG. 15 is a block diagram and a circuit diagram of a high frequency semiconductor integrated circuit according to a fourth embodiment.

Referring to FIG. 15, a high frequency semiconductor integrated circuit 400 according to the fourth embodiment includes a high frequency semiconductor integrated circuit 410, a high frequency semiconductor integrated circuit 420, and a wire 430. High frequency semiconductor integrated circuit 410 includes an input terminal 4101, a transistor 4102, a transmission line 4103, and a pad 4104. Transistor 4102 is connected to input terminal 4101 at the gate terminal thereof, ground terminal 7 at the source terminal thereof and transmission line 4103 at the drain terminal thereof Transmission line 4103 is connected between the drain terminal of transistor 4102 and pad 4104. Used as transmission line 4103, for example, is interconnect 3014 shown in FIG. 13A.

High frequency semiconductor integrated circuit 420 includes circuit blocks 421 to 424, and pads 425 to 428. Pads 425 to 428 are provided correspondingly to respective circuit blocks 421 to 424.

Wire 430 connects pad 4104 of high frequency semiconductor integrated circuit 410 to one of pads 425 to 428 of high frequency semiconductor circuit 420.

Figure 16:
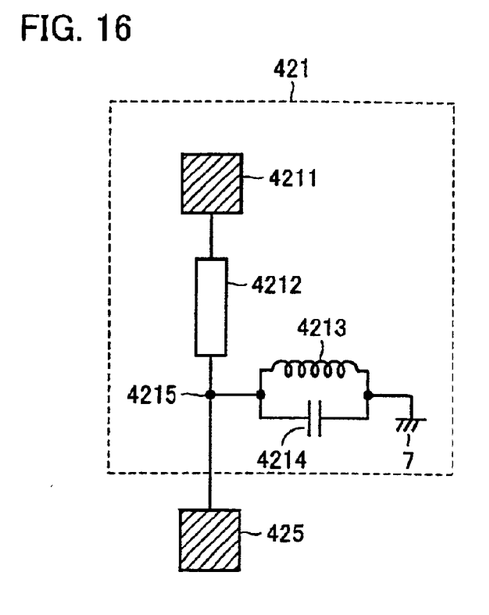
FIG. 16 is a circuit diagram of a circuit block shown in FIG. 15.

Referring to FIG. 16, circuit block 421 includes a pad 4211, a transmission line 4212, a coil 4213, and a capacitor 4214. Transmission line 4212 is connected between pad 4211 and pad 425. Used as transmission line 4212 is an interconnect having a predetermined length and a predetermined width. Coil 4213 and capacitor 4214 are connected in parallel between a node 4215 and ground node 7. When wire 430 is connected to pad 425, an input signal is transmitted to circuit block 421 through pad 425. Since a parallel circuit constituted of coil 4213 and capacitor 4214 acts on a high frequency signal as an impedance close to zero, the input signal is transmitted through transmission line 4212 with almost no loss to be caused by the parallel circuit and outputted from pad 4211. A signal having a frequency other than a frequency of the input signal is lost in the parallel circuit and the input signal is transmitted through transmission line 4212 and outputted from pad 4211.

Figure 17:
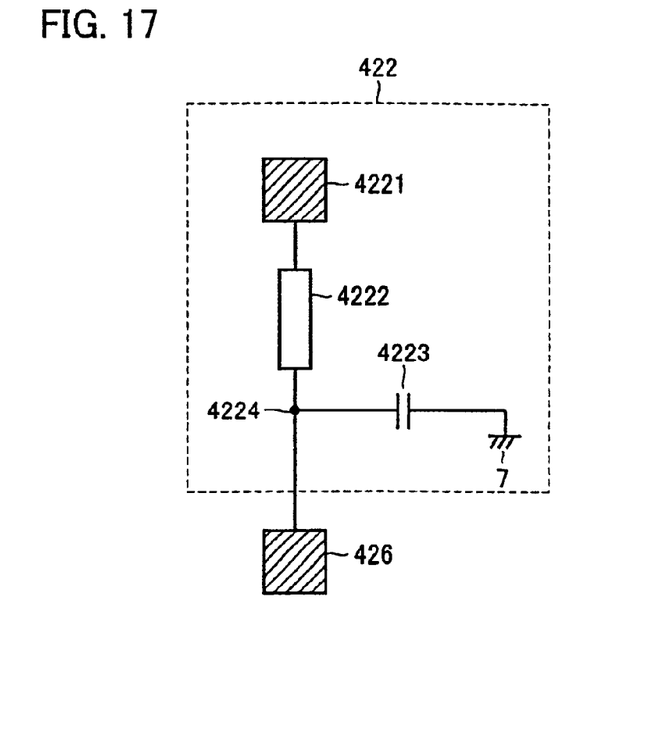
FIG. 17 is a circuit diagram of another circuit block shown in FIG. 15.

Referring to FIG. 17, circuit block 422 includes a pad 4221, a transmission line 4222, and a capacitor 4223. Transmission line 4222 is connected between pad 4221 and pad 426. Transmission line 4222 is constituted of an interconnect having a predetermined length and a predetermined width. Capacitor 4223 is connected between a node 4224 and ground node 7. Since capacitor 4223 does not act on a high frequency signal as an impedance, a circuit constituted of node 4224, capacitor 4223 and ground node 7 becomes a shorted circuit. When wire 430 is connected to pad 426, high frequency semiconductor integrated circuit 400 becomes the same circuit as high frequency semiconductor integrated circuit 200 in which wire 40 is connected to pad 55. Therefore, when pad 4221 is used as an output terminal, high frequency semiconductor integrated circuit 400 functions as a high frequency semiconductor integrated circuit having an impedance shown in FIG. 10.

Figure 18:
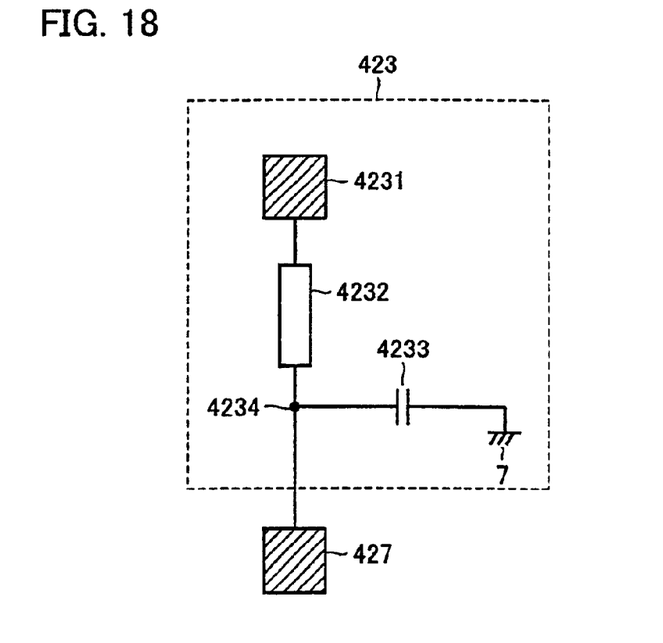
FIG. 18 is a circuit diagram of yet another circuit block shown in FIG. 15.

Referring to FIG. 18, circuit block 423 includes a pad 4231, a transmission line 4232, and a capacitor 4233. Transmission line 4232 is connected between pad 4231 and pad 427. Transmission line 4232 is constituted of an interconnect having a predetermined length and a predetermined width. Capacitor 4233 is connected between a node 4234 and ground node 7. Since capacitor 4233 does not act on a high frequency signal as an impedance, a circuit constituted of node 4234, capacitor 4233 and ground node 7 becomes a shorted circuit. When wire 430 is connected to pad 427, high frequency semiconductor integrated circuit 400 becomes the same circuit as high frequency semiconductor circuit 200 in which wire 40 is connected to pad 65. Therefore, when pad 4231 is used as an output terminal, high frequency semiconductor integrated circuit 400 functions as a high frequency semiconductor integrated circuit having an impedance of point A shown in FIG. 11.

Figure 19:
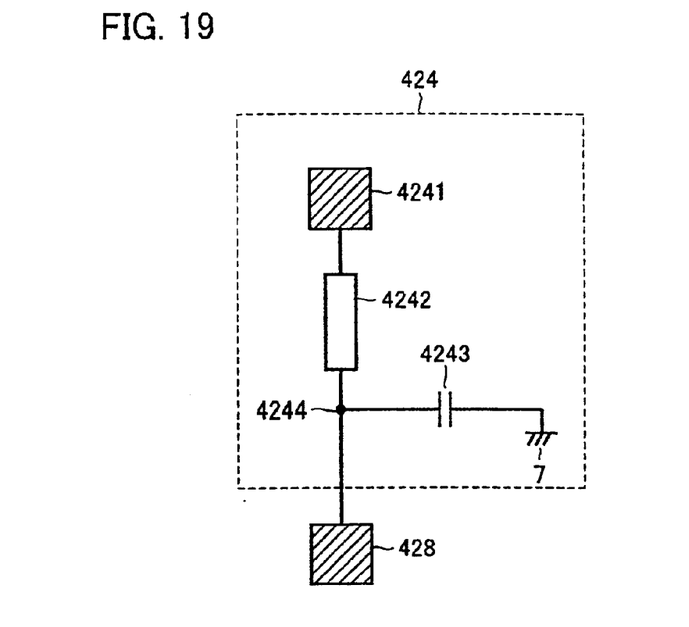
FIG. 19 is a circuit diagram of still another circuit block shown in FIG. 15.

Referring to FIG. 19, circuit block 424 includes a pad 4241, a transmission line 4242, and a capacitor 4243. Transmission line 4242 is connected between pad 4241 and pad 428. Transmission line 4242 is constituted of an interconnect having a predetermined length and a predetermined width. Capacitor 4243 is connected between a node 4244 and ground node 7. Since capacitor 4243 does not act on a high frequency signal as an impedance, a circuit constituted of node 4244, capacitor 4243 and ground node 7 becomes a shorted circuit. When wire 430 is connected to pad 428, high frequency semiconductor integrated circuit 400 becomes the same circuit as high frequency semiconductor integrated circuit 200 in which wire 40 is connected to pad 75. Therefore, when pad 4241 is used as an output terminal, high frequency semiconductor integrated circuit 400 functions as a high frequency semiconductor integrated circuit having an impedance of point B shown in FIG. 11.

Referring again to FIG. 15, by connecting pad 4104 to one of pads 425 to 428 of high frequency semiconductor integrated circuit 420 with wire 430, high frequency semiconductor integrated circuit 400 can function as a high frequency semiconductor integrated circuit having various kinds of performances.

In high frequency semiconductor integrated circuit 400, high frequency semiconductor integrated circuit 410 includes a main circuit only, high frequency semiconductor integrated circuit 420 includes a circuit block only. In such a manner, by fabricating a main circuit and a circuit block separately on semiconductor substrates, the number of chips in a semiconductor substrate on which a main circuit is fabricated can be increased.

Figure 20:
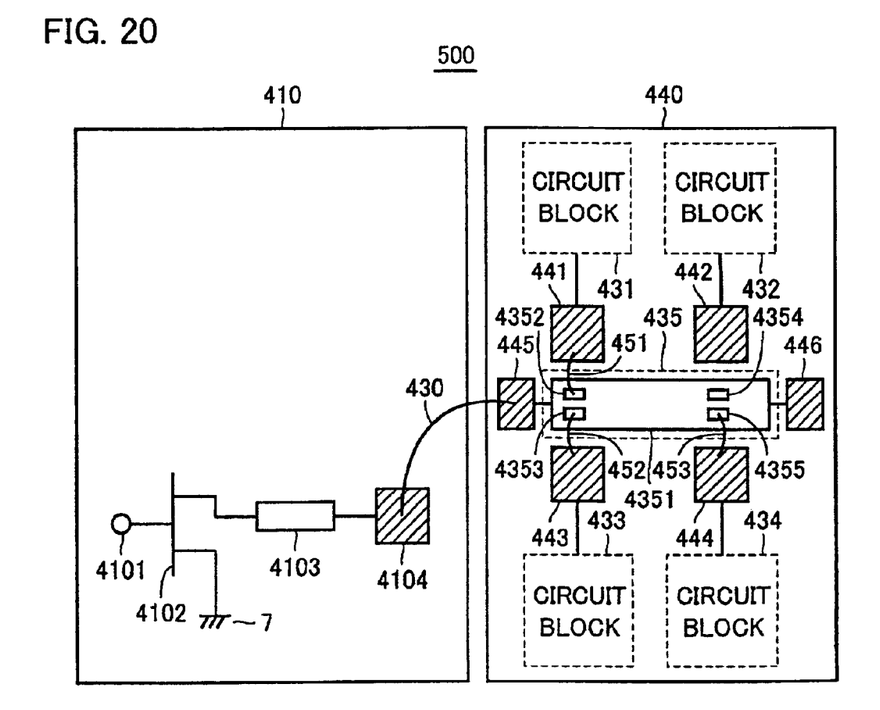
FIG. 20 is a block diagram and a circuit diagram of another high frequency semiconductor integrated circuit according to the fourth embodiment.

A high frequency semiconductor integrated circuit according to the fourth embodiment may be a high frequency semiconductor integrated circuit 500 shown in FIG. 20. High frequency semiconductor integrated circuit 500 includes high frequency semiconductor integrated circuit 410, wire 430, and a high frequency semiconductor integrated circuit 440. High frequency semiconductor integrated circuit 410 is as described above.

High frequency semiconductor integrated circuit 440 includes circuit blocks 431 to 435, pad 441 to 446, and wire 451 to 453. Pads 441 to 445 are provided correspondingly to respective circuit blocks 431 to 435.

Circuit block 435 includes an interconnect 4351, and pads 4352 to 4355. Pads 445 and 446 are connected to interconnect 4351 of circuit block 435. Wire 451 connects pad 441 to pad 4352 of circuit block 435. Wire 452 connects pad 443 to pad 4353 of circuit block 435. Wire 453 connects pad 444 to pad 4355 of circuit block 435.

Wire 430 connects pad 4104 of high frequency semiconductor integrated circuit 410 to pad 445 of high frequency semiconductor integrated circuit 440. Thereby, an input signal inputted at input terminal 4101 of high frequency semiconductor integrated circuit 410 is inputted to pad 445 of high frequency semiconductor integrated circuit 440 through transistor 4102, transmission line 4103, pad 4104 and wire 430. Then, the input signal is propagated through interconnect 4351 of circuit block 435 and outputted from pad 446.

Figure 21:
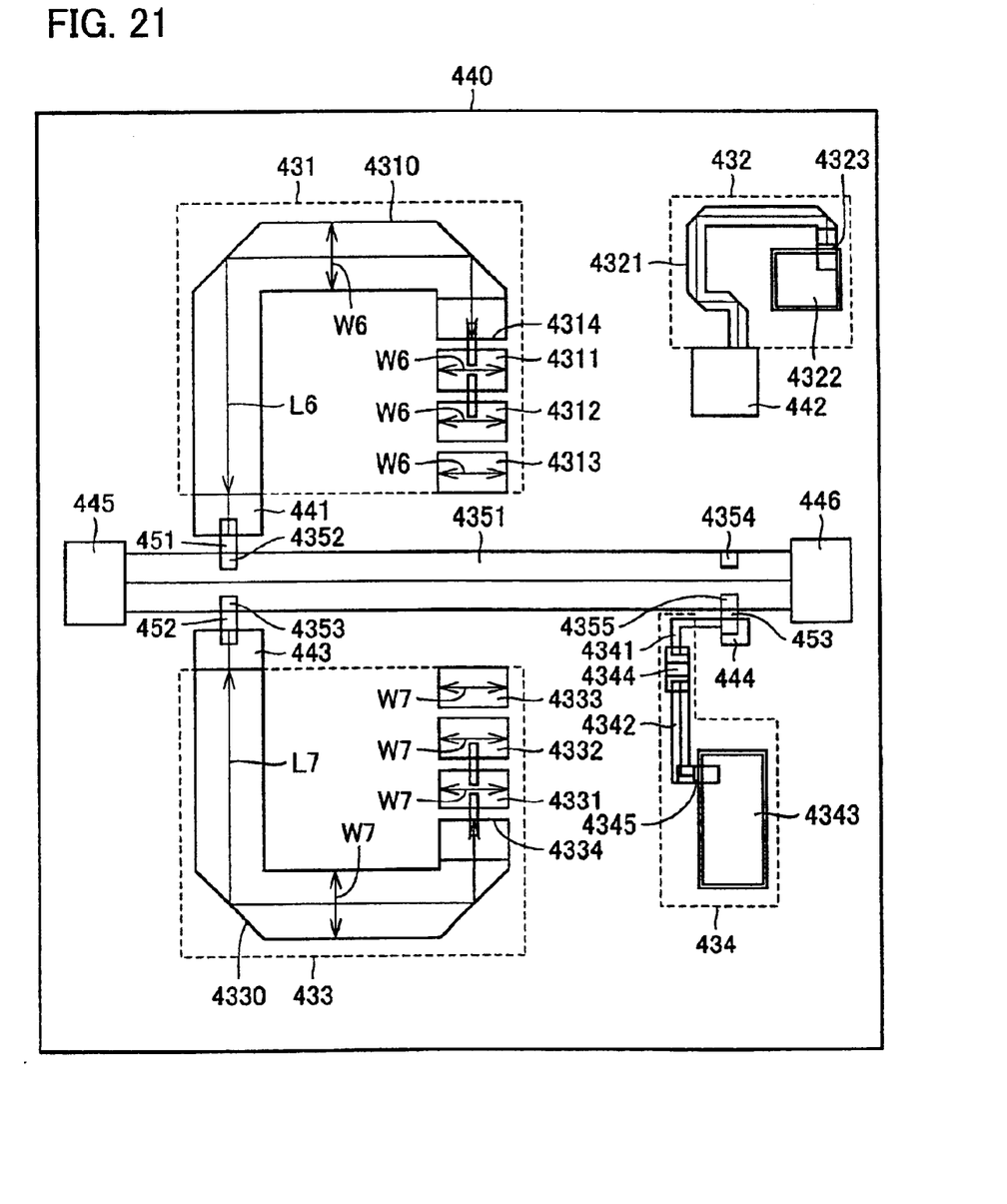
FIG. 21 is a plan view showing a specific example of one of two high frequency semiconductor integrated circuits shown in FIG. 20.

Referring to FIG. 21, detailed description will be given of high frequency semiconductor integrated circuit 440. Circuit block 431 includes: an interconnect 4310; and blocks 4311 to 4313. Interconnect 4310 is connected to pad 441 at one end thereof. Interconnect 4310 is made from metal having a length L6 and a width W6. A block 4311 is disposed spaced apart from the other end of wire 4310 by a predetermined distance. A block 4312 is disposed spaced apart from block 4311 by a predetermined distance. A block 4313 is disposed spaced apart from block 4312 by a predetermined distance. Blocks 4311 to 4313 respectively have the same width W6 as that of interconnect 4310 and made from the same metal as is interconnect 4310. Block 4311 can be connected to interconnect 4310 with a wire, block 4312 can be connected to block 4311 with a wire and block 4313 can be connected to block 4312 with a wire.

Length L6 of interconnect 4310 is determined such that $\lambda/4=L6$, where a wave length of an input signal is $\lambda$. Thereby, the input signal has the maximum amplitude (open) at the other end 4314 of interconnect 4310 and circuit block 431 acts on the input signal as a shorted circuit. Blocks 4311 to 4313 are used for adjustment of length L6 of interconnect 4310 such that interconnect 4310 functions as a shorted circuit when a frequency of the input signal changes.

Circuit block 433 includes an interconnect 4330, and blocks 4331 to 4333. Interconnect 4330 is connected to pad 443 at one end thereof. Interconnect 4330 is made from metal having a length L7 and a width W7. Block 4331 is disposed spaced apart from the other end of interconnect 4330 by a predetermined distance. Block 4332 is disposed apart from block 4331 by a predetermined distance. Block 4333 is disposed apart from block 4332 by a predetermined distance. Blocks 4331 to 4333 respectively have the same width W7 as does interconnect 4330 and made from the same metal as is interconnect 4330. Block 4331 can be connected to interconnect 4330 with a wire, block 4332 can be connected to block 4331 with a wire and block 4333 can be connected to block 4332 with a wire.

Length L7 of interconnect 4330 is determined such that $\lambda/4=L7$, where a wave length of an input signal is $\lambda$. Thereby, the input signal has the maximum amplitude (open) at the other end 4334 of interconnect 4330 and circuit block 433 acts on the input signal as a shorted circuit. Blocks 4331 to 4333 are used for adjustment of length L7 of interconnect 4330 such that interconnect 4330 functions as a shorted circuit when a frequency of the input signal changes.

Circuit block 432 includes an interconnect 4321, a block 4322, and a wire 4323. Interconnect 4321 is connected to pad 442 at one end thereof Block 4322 is disposed spaced apart from the other end of interconnect 4321 by a predetermined distance and can be connected to interconnect 4321 with wire 4323. A length of interconnect 4321 is determined such that an amplitude of a signal becomes zero at the other end. That is, circuit block 432 acts on the input signal as a shorted circuit.

Circuit block 434 includes interconnects 4341 and 4342, a block 4343, and wires 4344 and 4345. Interconnect 4341 is connected to pad 444 at one end thereof. One end of interconnect 4342 is disposed spaced apart from the other end of interconnect 4341 by a predetermined distance. Interconnect 4342 is connected to interconnect 4341 with wire 4344. Block 4343 is disposed spaced apart from the other end of interconnect 4342 by a predetermined distance and connected to interconnect 4342 with wire 4345. Circuit block 434 acts on an input signal as a circuit configured such that a coil and a capacitor are connected in series.

Referring again to FIG. 20, high frequency semiconductor integrated circuit 410 propagates an input signal through transistor 4102, transmission line 4103 and pad 4104 and outputs the input signal to high frequency semiconductor integrated circuit 440 through wire 430 when the input signal is inputted at input terminal 4101. Then, high frequency semiconductor integrated circuit 440 propagates the input signal inputted from pad 445 through interconnect 4351 of circuit block 435 and outputs the input signal from pad 446. In this case, since circuit blocks 431 and 433 respectively act on the input signal as a shorted circuit, the input signal is outputted from pad 446 after receiving an impedance determined by interconnect 4351 and circuit block 434. In this case, the input signal suffers small loss from circuit blocks 431 and 433.

In high frequency semiconductor integrated circuit 440, by connecting pad 442 to pad 4354 of circuit block 435 with a wire, a propagation characteristic of an input signal can be varied.

According to the fourth embodiment, since a high frequency semiconductor integrated circuit can be fabricated by connecting with a wire, a high frequency semiconductor integrated circuit including only a main circuit to a high frequency semiconductor integrated circuit including only a circuit block, the number of chips formed on a semiconductor substrate on which a main circuit is fabricated can be increased.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit comprising:
   a main circuit having an active element and a first pad;
   a circuit block including a passive element;
   a second pad connected to said circuit block; and
   a wire connecting said first pad to said second pad, wherein
      said main circuit includes an input terminal and an output terminal and said active element and said first pad are located between said input terminal and said output terminal,
      said circuit block includes an interconnect connected to said second pad, and
      said wire and said interconnect have lengths totaling one-fourth of a wavelength of a signal input to said input terminal.

* * * * *